(12) United States Patent
Ivanov et al.

(10) Patent No.: US 6,844,236 B2
(45) Date of Patent: Jan. 18, 2005

(54) METHOD AND STRUCTURE FOR DC AND RF SHIELDING OF INTEGRATED CIRCUITS

(75) Inventors: Tony G. Ivanov, Orlando, FL (US); Michael S. Carroll, Orlando, FL (US); Ranbir Singh, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/911,364

(22) Filed: Jul. 23, 2001

(65) Prior Publication Data

US 2003/0015772 A1 Jan. 23, 2003

(51) Int. Cl.$^7$ .............................................. H01L 21/76
(52) U.S. Cl. ........................ 438/406; 438/454; 438/430
(58) Field of Search ................................ 438/406, 430, 438/454; 257/630, 508, 659

(56) References Cited

U.S. PATENT DOCUMENTS

| | | | |
|---|---|---|---|
| 3,368,113 A | * | 2/1968 | Shaunfield ................. 257/508 |
| 5,091,330 A | * | 2/1992 | Cambou et al. ............ 438/406 |
| 5,151,769 A | | 9/1992 | Immorlica, Jr. et al. |
| 5,403,769 A | * | 4/1995 | Fujii ........................... 438/405 |
| 5,442,223 A | * | 8/1995 | Fujii ........................... 257/506 |
| 5,694,300 A | | 12/1997 | Mattei et al. |
| 5,804,495 A | * | 9/1998 | Saito et al. ................. 438/459 |
| 6,387,742 B2 | * | 5/2002 | Gauthier et al. ............ 438/197 |
| 2001/0008301 A1 | * | 7/2001 | Terui ........................... 257/659 |
| 2001/0026007 A1 | * | 10/2001 | Kagitani ..................... 257/659 |
| 2002/0072200 A1 | * | 6/2002 | Czagas et al. .............. 438/455 |
| 2002/0113296 A1 | * | 8/2002 | Cho et al. ................... 257/659 |
| 2003/0025180 A1 | * | 2/2003 | Alcoe et al. ................ 257/659 |

FOREIGN PATENT DOCUMENTS

| | | |
|---|---|---|
| EP | 0 340 959 | 11/1989 |
| WO | WO 02/067326 A2 | 8/2002 |

OTHER PUBLICATIONS

M. Bruel et al., Smart Cut: A Promising New SOI Material Technology, 178 Proceedings 1995 IEEE International SOI Conference, Oct. 1995, 2 pages.

* cited by examiner

*Primary Examiner*—George Fourson

(57) ABSTRACT

A method for electromagnetically shielding circuits which combine to form an integrated circuit device provides isolated silicon islands surrounded laterally and subjacently by conductive material. The isolated silicon islands may be covered individually or as a group by a conductive cover. The integrated circuit may include at least one silicon island including an analog circuit and at least one silicon island including a digital circuit, the analog and digital circuits electromagnetically shielded from one another. The method for forming the structure includes providing a first semiconductor substrate and hydrophilically bonding a substructure to the first semiconductor substrate. The substructure includes the isolated silicon islands surrounded by the conductive material. The substructure may be formed on a second semiconductor substrate by implanting an impurity region into an upper portion of the second semiconductor substrate. After bonding, the substructure may be separated from the remainder of the second substrate by propagating a crack along the boundary of the impurity region which separates the substructure from the remainder of the second semiconductor substrate. The method further includes forming the conductive cover over the isolated silicon island or islands by forming insulating layers over the silicon islands then forming a conductive cover layer and conductive sidewalls to surround the silicon island or islands being enclosed.

18 Claims, 4 Drawing Sheets

US 6,844,236 B2

METHOD AND STRUCTURE FOR DC AND RF SHIELDING OF INTEGRATED CIRCUITS

FIELD OF THE INVENTION

The present invention relates, most generally, to semiconductor integrated circuit devices. More particularly, the present invention relates to a method and structure for DC and RF shielding of integrated circuits.

BACKGROUND OF THE INVENTION

In today's advancing semiconductor manufacturing industry with increased levels of integration, integrated circuits are more commonly being formed to include both analog and digital circuits on the same chip. When both analog and digital circuits are placed on the same chip to form an integrated circuit, there is significant parasitic coupling between the two types of circuits. As a result, the performance of the circuits is degraded. It is therefore desirable to minimize such coupling. Integrated circuits may also be formed to include various analog circuits on a chip which may advantageously be isolated from one another. As an example, an analog transmitter circuit formed on a chip may generate enough power to saturate an analog receiver circuit formed on the same chip and render the receiver useless. It is therefore also desirable to isolate analog circuits from other analog circuits formed on the same chip to prevent such undesirable parasitic coupling. Generally speaking, it is desirable to provide both DC and RF isolation to the various analog and digital components placed on the same chip and which combine to form an integrated circuit.

Previous attempts to minimize parasitic coupling and to isolate the various analog and digital components from each other include low resistance buried layers formed by diffusion or implantation, and silicon-on-insulator substrates with oxide-filled trenches. The low resistance buried layers, however, lack vertical conducting surfaces and therefore only provide partial lateral isolation. Moreover, the resistivity of materials conventionally used to form the buried layer, is substantially higher than that of superior conductors such as metal, so these conventional materials provide less than optimal RF shielding. The silicon-on-insulator substrates with oxide-filled trenches provide good DC isolation, but the dielectric isolation material is the perfect media for the propagation of electromagnetic fields. As such, a shortcoming associated with using silicon-on-insulator substrates with oxide-filled trenches, is that virtually no RF isolation is provided.

It can therefore be seen that a method and apparatus for providing RF and DC shielding is desirable. More particularly, what is needed is a method and structure which isolates various analog and digital circuits which combine to form an integrated circuit, from each other.

SUMMARY OF THE INVENTION

To achieve these and other objects, and in view of its purposes, the present invention is directed to a method and structure for providing DC and electromagnetic shielding of the components which combine to form semiconductor integrated circuit devices. More particularly, the present invention is directed to providing silicon islands formed over a substrate and surrounded laterally and subjacently by a conductive material. Various semiconductor devices of the integrated circuit device are formed on the silicon islands. The silicon islands may be enclosed from above individually or as a group using discrete portions of the conductive films also used to form various device interconnect components. A number of silicon islands may be combined to form an integrated circuit device. Analog components formed on one silicon island are shielded from other analog or digital components formed on other silicon islands.

The method includes forming a first substrate, forming a substructure on a second substrate, then using a hydrophilic bonding process to join the substructure to the first substrate.

BRIEF DESCRIPTION OF THE DRAWINGS

The invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Like numerals denote like features throughout the drawing. Included in the drawing are the following figures.

DETAILED DESCRIPTION OF THE INVENTION

The present invention provides a method and structure for producing an integrated circuit composed of various circuits which are electromagnetically shielded from each other. The present invention provides a number of isolated silicon islands formed over a substrate and surrounded laterally and subjacently by a conductive material. Analog circuits formed on one silicon island are shielded from other analog or digital circuits formed on other silicon islands. Both DC and RF shielding are achieved. Various islands combine to form an integrated circuit device or other semiconductor product. Stated alternatively, various silicon islands combine to form a "chip."

In a preferred embodiment, further shielding may be achieved by enclosing the device components and circuits formed on and in the silicon islands, with a conductive cover. An individual island may be covered or the cover may extend over a group of silicon islands. The cover includes a top conductive layer and side conductive walls which are preferably formed using the various interconnection metal layers also used to form and interconnect the various circuits. Within various insulating layers formed over the silicon islands, a trench or a series of vias may be formed to peripherally surround the structures formed over the silicon island or group of silicon islands which are being enclosed. The conductive sidewalls of the conductive cover may be continuous or discontinuous. In either case, an opening or openings may be formed through the conductive sidewalls of the conductive cover to enable conductive interconnection wires to extend through the sidewalls of the conductive cover and to electrically contact the enclosed and shielded components.

The process for forming the isolated silicon islands includes providing a first substrate and providing a substructure formed on a second substrate, then bonding the substructure of the second substrate, to the first substrate. A hydrophilic bonding process is used to join the first substrate to the substructure of the second substrate. The bulk of the second substrate is then separated from the substructure, most preferably along a crack propagated by heat along the boundary of an ion-implanted impurity layer formed in the second substrate and which includes the substructure. Other separation techniques may be used alternatively. Both the hydrophilic bonding technique and the technique for splitting the substrate along a crack propagated along the boundary of an ion-implanted impurity layer, are taught with respect to bulk, unpatterned substrates in "Smart Cut: A Promising New SOI Material Technology," M. Bruel, et al., 178 Proceedings, 1995, IEEE International SOI Conference, October 1995, the contents of which are hereby incorporated by reference.

The novel process and structure of the present invention is best understood from the following figures.

Figure 1:
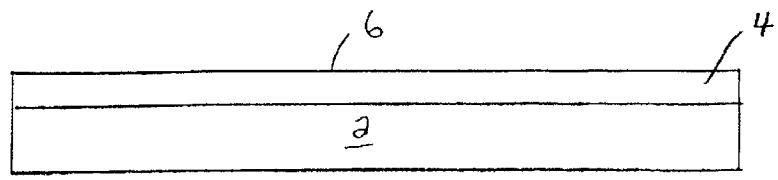
FIG. 1 is a cross-sectional view showing the first substrate.

FIG. 1 is a cross-sectional view showing first substrate 2. In the preferred embodiment, first substrate 2 may be a silicon wafer, but other suitable semiconductor substrate materials, such as gallium arsenide, may be used alternatively. Insulating layer 4 is formed on first substrate 2 and includes first surface 6. Insulating layer 4 may be a silicon dioxide film formed by thermal oxidation or other techniques. Insulating layer 4 may alternatively be formed of other conventional dielectric materials and using conventional formation methods.

Figure 2:
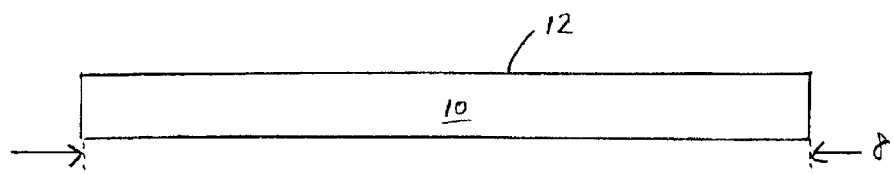
FIG. 2 is a cross-sectional view showing the second substrate.

FIG. 2 is a cross-sectional view showing second substrate 10. Second substrate 10 includes second surface 12. Second substrate 10 is a silicon wafer in the preferred embodiment, but other semiconductor materials may be used alternatively. Second substrate 10 may be a silicon substrate having a major surface along a <100> or <111> plane. In the preferred embodiment, second substrate 10 will be chosen to have the same lateral dimension 8 and the same shape, as first substrate 2. For example, each may be a conventional 8 inch wafer.

Figure 3:
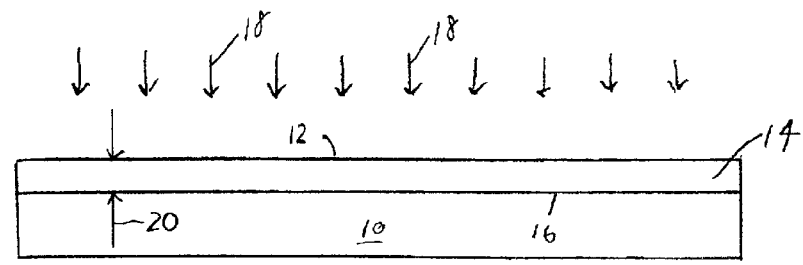
FIG. 3 is a cross-sectional view showing the second substrate after an implantation process has been used to form an upper impurity layer.
Figure 4:
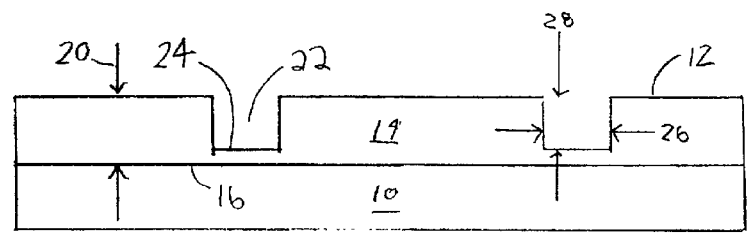
FIG. 4 is a cross-sectional view of the second substrate showing trenches formed in the impurity layer.

Now turning to FIG. 3, an ion implantation process, indicated by arrows 18, is used to introduce hydrogen or other inert atoms into second substrate 10, through second surface 12. This ion implantation process forms impurity region 14 within the upper portion of second substrate 10. Impurity region 14 includes lower boundary 16 and includes depth 20. According to an exemplary embodiment, depth 20 may range from 2 to 4 microns but other depths may be used alternatively. In the preferred embodiment, depth 20 may be on the order of 3 microns. It will be later shown that a substructure will be formed within impurity region 14 and will be later separated from the bulk of second substrate 10 most advantageously along a crack propagated along lower boundary 16.

After impurity region 14 is formed, trenches 22 are formed within impurity region 14 using conventional processing techniques. Trenches 22 include trench bottoms 24 and may be formed to a depth ranging from 2 to 3 microns according to various exemplary embodiments. According to the preferred embodiment, not shown, depth 28 of trench 22 will be equal to depth 20 of impurity region 14. Width 26 of trench 22 may vary according to various exemplary embodiments and will generally lie within the range of 1 to 3 microns.

Figure 5:
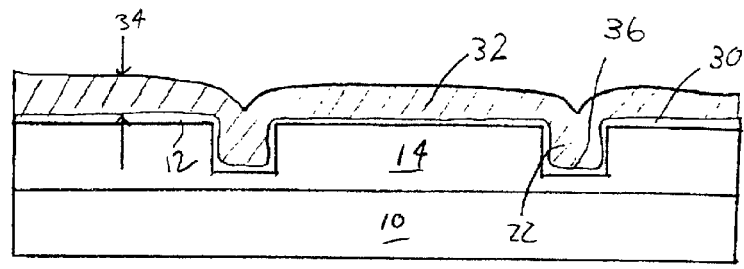
FIG. 5 is a cross-sectional view of the second substrate shown in FIG. 4, after an oxide layer and conductive film have been added.

Now turning to FIG. 5, conductive film 32 is formed filling trenches 22. Conductive film 32 is chosen to be a low resistivity film with a high melting point. In the preferred embodiment, tungsten, W, may be used. According to other exemplary embodiments, other materials such as nickel or polycrystalline silicon may be used. Thickness 34 of conductive film 32 is chosen to completely fill trenches 22 and also to remain continuous over second surface 12 after a subsequent planarization process is carried out as will be shown in FIG. 6. Conductive film 32 includes trench fill portions 36. According to an exemplary embodiment, an optional oxide liner film may be formed over the substrate prior to the formation of conductive film 32. Oxide liner film 30 may be formed over second surface 12 and within trenches 22 using conventional methods, such as thermal oxidation. Oxide liner film 30 may assist in preventing out-diffusion throughout the structure. In the subsequent figures, optional oxide liner film 30 will not be shown and, therefore, conductive film 32 will be shown to include trench fill portions 36 which extend to contact trench bottom 24.

Figure 6:
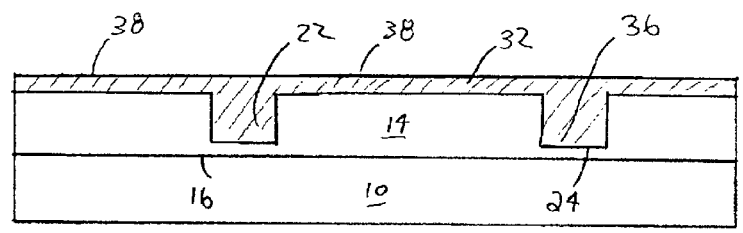
FIG. 6 is a cross-sectional view of the second substrate shown in FIG. 5, after a planarization technique has been carried out to planarize the top surface.

Now turning to FIG. 6, a planarization process is carried out to planarize conductive film 32 and form a planar top surface 38 of conductive film 32. Conventional polishing techniques, such as chemical mechanical polishing (CMP), may be used for planarizing. Other planarizing techniques may be used according to other exemplary embodiments.

Figure 7:
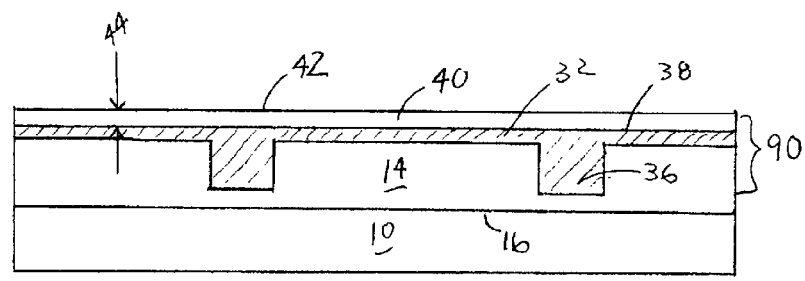
FIG. 7 is a cross-sectional view of the second substrate shown in FIG. 6, after a dielectric film has been added.

FIG. 7 shows dielectric film 40 formed over planar top surface 38 of conductive film 32. In the preferred embodiment, dielectric film 40 may be an oxide film formed using conventional methods but other dielectric films may be used alternatively. Dielectric film 40 may also be planarized according to an exemplary embodiment and will include dielectric surface 42, which is substantially planar. Dielectric film 40 also includes post-planarization thickness 44, which may vary according to various exemplary embodiments and may range from 0.5 to 4 microns. Substructure 90 now includes silicon impurity region 14, dielectric film 40 and conductive film 32 which extends into trenches 22 formed in silicon impurity region 14. It will be seen that dielectric surface 42 will be bonded to first surface 6 of first substrate 2, which is shown in FIG. 1. This hydrophilic bonding technique is as discussed in the M. Bruel, et al. article. Prior to the hydrophilic bonding technique, each of dielectric surface 42 of dielectric film 40 and first surface 6 of first substrate 2 will preferably undergo a conventional RCA clean. It will later be seen that substructure 90 will be separated from the bulk of second substrate 10 along lower boundary 16 after substructure 90 is joined to first substrate 2.

Figure 8:
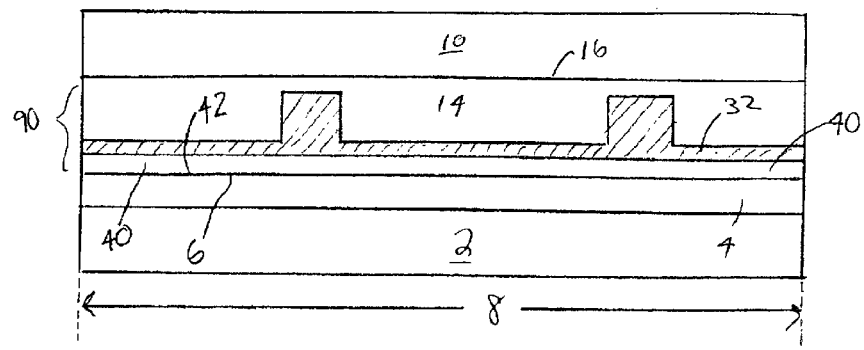
FIG. 8 is a cross-sectional view showing the second substrate shown in FIG. 7, in overturned position and bonded to the first substrate shown in FIG. 1.

FIG. 8 shows substructure 90 of second substrate 10 in overturned position and bonded to first substrate 2. More particularly, the substrates are aligned to each other and first surface 6 of insulating layer 4 of first substrate 2 is hydrophilically bonded to dielectric surface 42 of dielectric film 40 of substructure 90, which is formed over second substrate 10. The hydrophilic bonding preferably takes place at room temperature. In the preferred embodiment, each of first substrate 2 and second substrate 10 will include the same lateral dimensions. This is generally indicated by lateral dimension 8, which is shown to be equal for first substrate 2 and second substrate 10. It should be understood, however, that lateral dimension 8 is representative only, and also that FIG. 8 only represents a portion of first substrate 2 and second substrate 10. Generally speaking, it is preferred that a 6-inch wafer is bonded to a 6-inch wafer, for example, and that a 12-inch wafer is bonded to a 12-inch wafer, etc., with wafer flats aligned to one another. The bonded surfaces are virtually void-free. Next, the bulk of second substrate 10 will be separated from substructure 90 along lower boundary 16 of impurity region 14.

Figure 9:
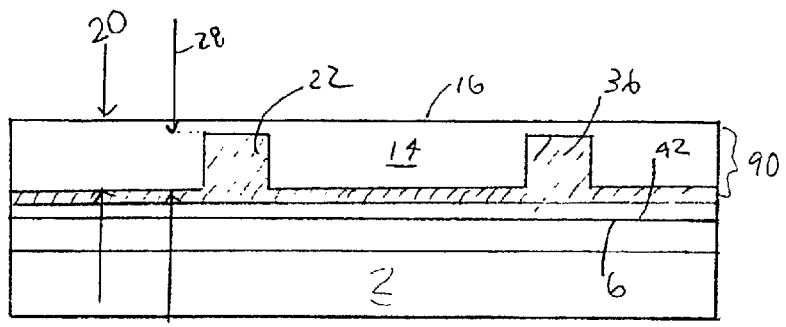
FIG. 9 is a cross-sectional view of the structure shown in FIG. 8 after portions of the second substrate have been removed.

Now turning to FIG. 9, a micro-cleaving process is preferably used to propagate a crack along lower boundary 16 of impurity region 14 (as shown in FIG. 8) and to separate substructure 90 from the bulk of second substrate 10 as shown in FIG. 9. This two-phase heat treatment process of the bonded wafers is preferably used to propagate the crack and is described in the Bruel, et al. article. According to other exemplary embodiments, other techniques maybe used to separate substructure 90 from the bulk of second substrate 10 after substructure 90 has been bonded to first substrate 2. Back-grinding, lapping, etch back, and cutting techniques, for example, may be used. In the exemplary embodiment shown, after splitting, trench fill portions 36 of conductive film 32 do not extend to lower boundary 16, now shown as the top surface. This is because depth 20 of impurity region 14 is greater than depth 28 of trench 22. Therefore, a polishing process will be carried out to recede lower boundary 16 such that sections of trench fill portions 36 of conductive film 32 are exposed on the top of the structure. In the preferred embodiment, trench fill portions 36 extend to lower boundary 16, which is now the top surface, and, therefore, a polishing process is not needed after the separation process, to recede the top surface 16.

Figure 10:
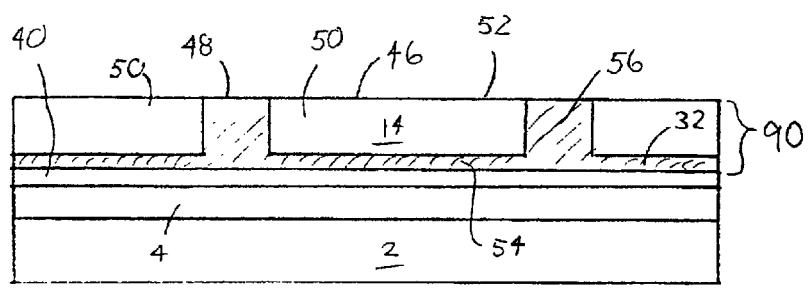
FIG. 10 is a cross-sectional view of the structure shown in FIG. 9 after a planarization technique has been carried out.

FIG. 10 shows the structure shown in FIG. 9 after such a polishing technique has been carried out. According to one exemplary embodiment, CMP may be used. Other polishing techniques such as back-grinding, lapping, etch back, and other cutting techniques may alternatively be used to produce the structure shown in FIG. 10. FIG. 10 shows receded or polished upper surface 46, which includes upper surface 48 of vertical conductive material 56 and upper surface 52 of isolated silicon islands 50. Isolated silicon islands 50 are therefore surrounded subjacently by subjacent portion 54 of conductive film 32 and are surrounded laterally and peripherally by vertical portions 56 of conductive film 32. Although only two opposed lateral sides of the centrally disposed silicon island 50 are shown in the two-dimensional illustration of FIG. 10, all of the lateral edges of silicon island 50 are bounded by vertical sections 56 of conductive film 32. Substructure 90 now includes a top portion consisting of conductive film 32 and silicon impurity region 14 including isolated silicon islands 50, and a bottom portion formed of dielectric film 40.

Figure 11:
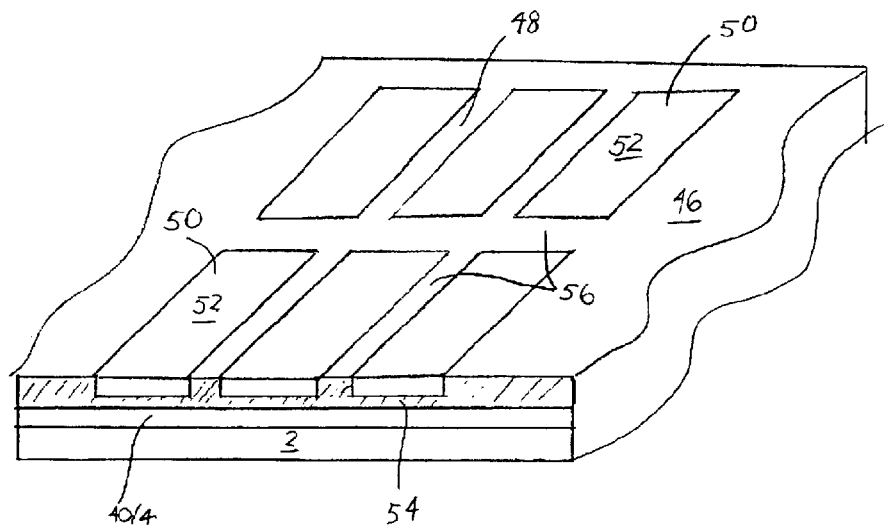
FIG. 11 is a perspective, cross-sectional view of silicon islands formed over a substrate and surrounded subjacently and laterally by a conductive material.

FIG. 11 shows first substrate 2 having multiple isolated silicon islands 50 formed thereover. Dielectric layer 40/4 represents original dielectric film 40 hydrophilically bonded to original insulating layer 4. Polished upper surface 46 includes portions of upper surface 48 of conductive film 32 and upper surface 52 of silicon islands 50. Each of silicon islands 50 are surrounded peripherally and laterally by vertical portions 56 of conductive film 32 and subjacently by subjacent portion 54 of conductive film 32. It can be therefore appreciated that silicon islands 50 are isolated from each other and electromagnetically shielded from one another. Therefore, an analog circuit formed on one of silicon islands 50 would be electromagnetically shielded from a digital circuit, for example, formed on another of silicon islands 50. By analog or digital circuit, it is meant that a number of semiconductor devices such as transistors, combine to form the analog or digital circuit. More generally, an analog or digital circuit formed on one silicon island 50, is shielded from other circuits—analog or digital, formed on other of silicon islands 50.

A number of silicon islands 50 may be combined to form an integrated circuit device. Such integrated circuit device may be formed of any number of isolated silicon islands 50, each of which may include an analog circuit, a digital circuit, or both thereon. Although silicon islands 50 are substantially electromagnetically shielded from one another as shown in FIG. 11 because they are peripherally and subjacently surrounded by conductive film 32, additional electromagnetic shielding may be obtained by forming a conductive cover to enclose an individual silicon island 50 or a group of silicon islands 50. An exemplary conductive cover is shown in FIG. 12.

Figure 12:
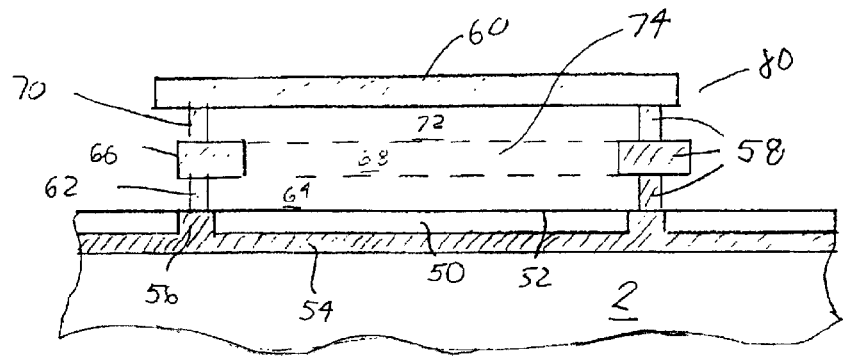
FIG. 12 is a cross-sectional view of an exemplary conductive cover formed over an isolated silicon island.

FIG. 12 is a cross-sectional view of an exemplary conductive cover which encloses and therefore shields silicon island 50. Conductive cover 80 is capable of suppressing electromagnetic radiation from traveling therethrough. It should be understood that such a conductive cover 80 is exemplary only, and, in alternative embodiments, conductive cover 80 may be formed to cover a group of silicon islands 50. Conductive cover 80 includes conductive cover layer 60 and conductive sidewalls 58. Conductive sidewalls 58 may be formed of multiple conductive layers aligned over one another. In the exemplary embodiment, the multiple conductive layers may be first metal layer 62, second metal layer 66, and third metal layer 70. In addition to forming parts of conductive sidewall 58, each of first metal layer 62, second metal layer 60 and third metal layer 70 may advantageously be used to form portions and interconnect the semiconductor devices formed on silicon islands 50.

It can be seen that conductive cover 80, in conjunction with subjacent portion 54 and vertical portions 56, encloses silicon island 50 and any devices, circuits, or components (not shown) formed either on or in silicon island 50. In the preferred embodiment, a succession of dielectric layers, such as first dielectric layer 64, second dielectric layer 68, and third dielectric layer 72 may be successively formed over silicon island 50 and will include various device features and interconnection leads which extend through the dielectric layers. In the preferred embodiment and using damascene processing, openings may be successively formed in each of the dielectric layers along the peripheral boundary of the silicon island or group of silicon islands which are desired to be enclosed. After each of the openings is formed, conventional conductive materials, such as aluminum or tungsten may be used to fill the openings. As will be seen in FIGS. 13 and 14, the openings may be a continuous trench which extends peripherally around the silicon island or islands being enclosed, or the openings may be a series of closely spaced via openings formed in a linear array which extends along the peripheral edge of the silicon island or group of silicon islands which is desired to be enclosed. In either case, the openings are subsequently filled with conductive material using conventional processing, to form conductive sidewalls 58. Also in either case, the conductive sidewalls 58 extend along the peripheral boundary of the silicon island 50 or group of silicon islands being enclosed, and downward to meet vertical portions 56. As such, the illustration in FIG. 12 is understood to be a cross-section taken generally along a central portion of conductive cover 80 formed over a single silicon island 50.

Figure 13:
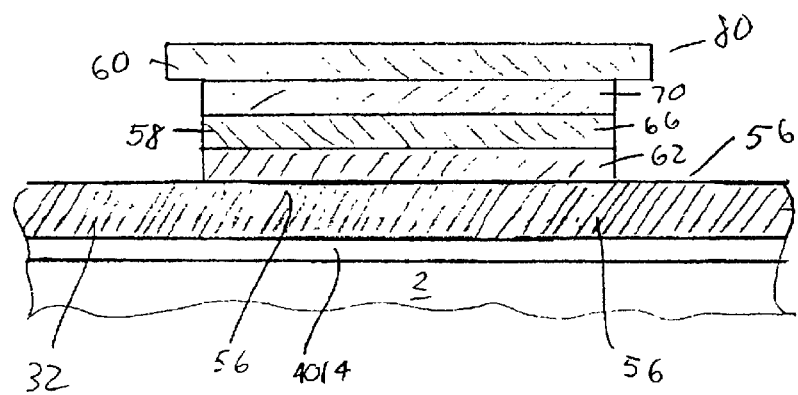
FIG. 13 is a cross-sectional view taken along a sidewall of an exemplary conductive cover.

FIG. 13 shows a cross-sectional view taken along one sidewall 58 of conductive cover 80. FIG. 13 shows an exemplary conductive sidewall 58 of conductive cover 80 formed of three distinct conductive films 62, 66, and 70, which are substantially continuous and therefore form a continuous conductive sidewall. Conductive films 62,66, and 70 may be successively formed in trench openings formed in respective dielectric layers (not shown). Conductive sidewall 58 extends down to contact vertical portion 56 which surrounds the silicon island (not shown).

Figure 14:
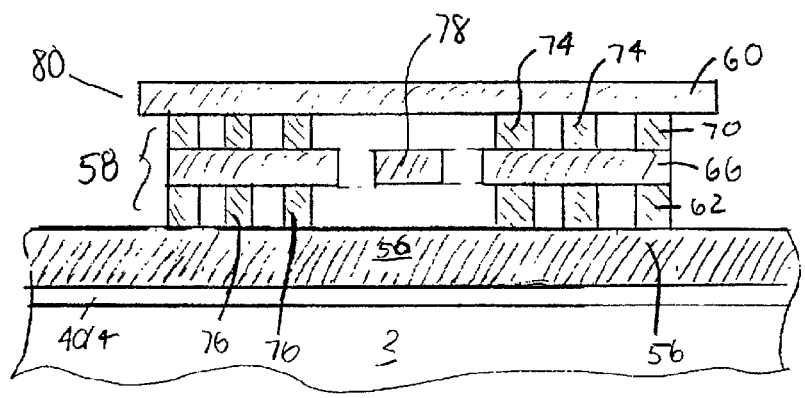
FIG. 14 is a cross-sectional view taken along another exemplary embodiment of a sidewall of a conductive cover.

FIG. 14 shows a cross-sectional view taken along another exemplary sidewall 58 of exemplary conductive cover 80. In the exemplary conductive sidewall 58 shown in FIG. 14, conductive sidewall 58 is shown to be a discontinuous feature. Second metal layer 66 forms a continuous layer except in the central portion of sidewall 58, while each of first metal layer 62 and third metal layer 70 form a linear array of filled vias such as filled vias 74 of third metal layer 70 and filled vias 76 of first metal layer 62. In the central portion of conductive sidewall 58 of conductive cover 80, conductive interconnect lead 78 is formed and extends in and out of the plane of the illustration of FIG. 14. Conductive interconnect lead 78 provides for electrical coupling of the components, devices, and circuits formed within the enclosed structure to features outside the closed structure, for example, to features enclosed within another shielded silicon island or group of silicon islands. It is understood that when openings are formed in the conductive sidewalls, such openings are filled with insulating materials.

It should be emphasized that the present invention is not intended to be limited to the embodiments shown. The conductive sidewalls shown in each of FIGS. 13 and 14 are intended to be exemplary only. Various levels of conductive materials may be combined to form the sidewalls. Various conductive materials may also be used. Various configurations of filled vias and continuous metal lines may also be used. Furthermore, multiple openings may be created within any of conductive sidewalls 58 to allow for an interconnect lead, such as conductive interconnect lead 78 shown in FIG. 14, to provide electrical coupling to components which are enclosed within conductive cover 80. Discontinuous conductive sidewalls 58 of conductive cover 80 still serve to provide suitable DC and RF shielding. It should also be emphasized that in some exemplary embodiments, conductive cover 80 may not be needed.

The preceding description merely illustrates the principles of the invention. It will thus be appreciated that those skilled in the art will be able to devise various arrangements which, although not explicitly described or shown herein, embody the principles of the invention and are included within its scope and spirit. Furthermore, all examples and conditional language recited herein are principally intended to be expressly for pedagogical purposes to aid the invention and concept contributed by the inventors to furthering the art, and are to be construed as being without limitation to such specifically recited examples and conditions.

Moreover, all statements herein reciting principles, aspects and embodiments of the invention, as well as specific examples thereof, are intended to encompass both structure and functionally equivalence thereof. Additionally, it is intended that such equivalents include both currently known, as well as equivalents developed in the future, i.e., any elements developed that perform the same functions regardless of structure. As such, the invention is not intended to be limited to the details shown. Rather, various modifications and additions may be made to details within the scope and range of equivalence of the claims and without departing from the invention. Accordingly, it is intended by the appended claims to cover all such modifications and changes as far within the true spirit and scope of the invention.

What is claimed is:

1. A method for forming a semiconductor product, comprising:

providing a semiconductor substrate having an insulating layer formed thereover and including a top surface;

providing a substructure having a bottom portion formed of a dielectric film;

bonding said bottom portion of said substructure to said top surface of said substrate;

forming isolated silicon sections, each bonded subjacently by horizontal sections of a conductive material and laterally by vertical sections of said conductive material, in a top portion of said substructure; and enclosing a group of the isolated silicon sections with additional conductive material.

2. The method as in claim 1 in which said enclosing includes forming insulating materials over said group of isolated silicon sections, forming a conductive cover layer over said insulating materials and forming side conductive materials extending from said conductive cover layer to said vertical sections which peripherally surround said group.

said conductive cover layer and said side conductive materials combining to electromagnetically shield said group.

3. The method as in claim 1 in which said enclosing includes, for each isolated silicon section being enclosed, forming insulating materials over said isolated silicon section, forming a conductive cover layer over said insulating materials and forming side conductive materials extending from said conductive cover layer to said vertical sections which bound said isolated silicon section;

said conductive materials, said conductive cover layer and said side conductive materials combining to electromagnetically shield said isolated silicon section.

4. The method as in claim 3, in which said forming insulating materials includes, for each isolated silicon section being enclosed, forming a succession of insulating layers and forming trenches in each of said succession of insulating layers, said trenches extending along the periphery of said isolated silicon section, and filling said trenches with said side conductive materials.

5. The method as in claim 3, in which said horizontal sections of conductive material, said vertical sections of said conductive material, said conductive cover layer and said side conductive materials are each formed of tungsten.

6. The method as in claim 3, in which said forming insulating materials includes, for each isolated silicon section being enclosed, fanning a succession of insulating layers and said enclosing includes forming one of a continuous opening and a linear array of spaced openings in each of said succession of insulating layers above said vertical sections which bound said isolated silicon section, and filling said formed corresponding openings with said side conductive materials.

7. The method as in claim 1, in which said providing a substructure includes providing a further substrate having said substructure formed as a portion thereof and further comprising separating said substructure from other portions of said further substrate.

8. The method as in claim 7, in which said separating takes place after said bonding.

9. The method of claim 7, in which said separating comprises one of backgrinding and etching.

10. The method as in claim 7, in which said providing a substructure includes providing said further substrate having a top surface, implanting hydrogen into an upper region of said further substrate, said upper region including a subjacent boundary, fanning trenches within maid upper region and extending vertically downward from said top surface, forming said conductive material over said top surface and filling said trenches, and forming said dielectric film over said conductive material thereby forming said substructure in overturned position as a top portion of said further substrate and, said separating includes separating said substructure from other portions of said further substrate along a crack propagated along said subjacent boundary.

11. The method as in claim 10 in which said separating includes heating to a temperature within the range of 400° C. to 600° C.

12. The method as in claim 10, further comprising planarizing after said forming said conductive material over said top surface of said further substrate and filling said trenches, and prior to said forming said dielectric film.

13. The method as in claim 1, in which said bonding comprises hydrophilic bonding.

14. The method as in claim 1, wherein said vertical sections of said conductive material and said horizontal sections of said conductive material each comprise tungsten.

15. The method as in claim 1, wherein said insulating layer comprises a silicon dioxide layer and said dielectric film comprises a silicon dioxide film and said bonding includes hydrophilic bonding.

16. The method as in claim 2, in which said side conductive materials are not continuous and include openings that extend through said side conductive materials, and further comprising forming interconnect leads extending through said openings.

17. The method as in claim 3, in which said side conductive materials are not continuous and include openings that extend through said side conductive materials, and further comprising forming interconnect loads extending through said openings.

18. The method as in claim 7, in which providing said substructure includes providing said substructure including silicon formed over said horizontal sections of said conductive material and over said vertical sections of said conductive material, and said forming isolated silicon sections including polishing to produce isolated silicon sections.

* * * * *